United States Patent
Wang et al.

(10) Patent No.: US 11,621,318 B2
(45) Date of Patent: Apr. 4, 2023

(54) CAPACITOR, SEMICONDUCTOR DEVICE, AND METHOD FOR PREPARING CAPACITOR

(71) Applicant: NANYA TECHNOLOGY CORPORATION, New Taipei (TW)

(72) Inventors: Mao-Ying Wang, New Taipei (TW); Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/358,195

(22) Filed: Jun. 25, 2021

(65) Prior Publication Data

US 2022/0416012 A1 Dec. 29, 2022

(51) Int. Cl.
*H01L 27/105* (2023.01)
*H01L 49/02* (2006.01)
*H01L 27/108* (2006.01)

(52) U.S. Cl.
CPC ........ *H01L 28/75* (2013.01); *H01L 27/10814* (2013.01); *H01L 28/40* (2013.01); *H01L 28/56* (2013.01); *H01L 28/91* (2013.01)

(58) Field of Classification Search
CPC ............... H01L 28/40; H01L 27/10805; H01L 27/1085; H01L 28/56; H01L 28/75; H01L 27/10814; H01G 4/1236; H01G 4/10; H01G 4/33
See application file for complete search history.

(56) References Cited

U.S. PATENT DOCUMENTS

| 2006/0113580 | A1 | 6/2006 | Cho et al. | |
| 2010/0155889 | A1* | 6/2010 | Cho | H01L 28/60 257/532 |
| 2010/0159700 | A1 | 6/2010 | Eun | |
| 2011/0057239 | A1* | 3/2011 | Arao | H01L 27/10852 257/532 |
| 2012/0064689 | A1* | 3/2012 | Hirota | H01L 27/10814 438/381 |
| 2012/0211865 | A1 | 8/2012 | Tian et al. | |
| 2013/0217202 | A1* | 8/2013 | Malhotra | H01L 28/40 438/396 |

(Continued)

FOREIGN PATENT DOCUMENTS

JP 2001144270 A 5/2001
TW 200503186 1/2005

*Primary Examiner* — Ahmed N Sefer
(74) *Attorney, Agent, or Firm* — Muncy, Geissler, Olds & Lowe, P.C.

(57) ABSTRACT

The present disclosure provides a capacitor, a semiconductor device, and a method for preparing a capacitor. The semiconductor device includes a plurality of memory cells, at least one of the memory cells including a capacitor. The capacitor includes a first electrode comprising titanium nitride and disposed on a substrate, a dielectric film disposed on the first electrode, a multilayer film disposed on the dielectric film, and a second electrode comprising titanium nitride and disposed on the multilayer film. The method for preparing the capacitor includes forming the first electrode comprising titanium nitride on the substrate, forming a dielectric film on the first electrode, forming the multilayer film on the dielectric film, and forming the second electrode comprising titanium nitride on the multilayer film.

9 Claims, 8 Drawing Sheets

(56) References Cited

U.S. PATENT DOCUMENTS

| | | | |
|---|---|---|---|
| 2015/0171179 A1* | 6/2015 | Horii | H01L 28/75 |
| | | | 257/761 |
| 2015/0228710 A1* | 8/2015 | Rui | H01L 27/10805 |
| | | | 438/396 |
| 2020/0312552 A1* | 10/2020 | Kim | H01G 4/1272 |
| 2021/0066446 A1* | 3/2021 | Lee | H01L 27/10814 |

* cited by examiner

Arranging the dielectric film and the multilayer film to structurally stabilize the capacitor — 505

Arranging the multilayer film in a stacking structure comprising a first material layer, a second material layer disposed on the first material layer, a third material layer disposed on the second material layer, and a fourth material layer disposed on the third material layer — 506

CAPACITOR, SEMICONDUCTOR DEVICE, AND METHOD FOR PREPARING CAPACITOR

TECHNICAL FIELD

The present disclosure relates to a capacitor, a semiconductor device, and a method for preparing a capacitor, and more particularly, to a structurally stable capacitor and a method for preparing the capacitor.

DISCUSSION OF THE BACKGROUND

In the semiconductor industry, rapid growth has been experienced due to improvements with integration density. However, as device features shrink and cell capacitors of memory cells are being scaled down, conformal and thin film formation of stacked capacitors is typically required. The stacked capacitors often suffer from a wobbling phenomenon due to lower electrode collapse and deformation, which may lead to excess leakage current and device failure. Therefore, structurally stable capacitors and methods for preparing such capacitors for use in semiconductor devices are highly desirable.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a capacitor, comprising a first electrode comprising titanium nitride and disposed on a substrate; a dielectric film disposed on the first electrode; a multilayer film disposed on the dielectric film; and a second electrode comprising titanium nitride and disposed on the multilayer film.

In some embodiments, the dielectric film comprises aluminum oxide.

In some embodiments, the first electrode, the dielectric film, and the multilayer film are arranged to structurally stabilize the capacitor.

In some embodiments, the multilayer film is arranged in a stacking structure comprising a first material layer, a second material layer disposed on the first material layer, a third material layer disposed on the second material layer, and a fourth material layer disposed on the third material layer.

In some embodiments, the first material layer comprises hafnium.

In some embodiments, the second material layer and the fourth material layer comprise zirconium oxide.

In some embodiments, the third material layer comprises aluminum oxide.

Another aspect of the present disclosure provides a semiconductor device, comprising a plurality of memory cells, at least one of the memory cells comprising a capacitor, the capacitor comprising: a first electrode comprising titanium nitride and disposed on a substrate; a dielectric film disposed on the first electrode; a multilayer film disposed on the dielectric film; and a second electrode comprising titanium nitride and disposed on the multilayer film.

In some embodiments, the dielectric film comprises aluminum oxide.

In some embodiments, the dielectric film and the multilayer film are arranged to structurally stabilize the capacitor.

In some embodiments, the multilayer film is arranged in a stacking structure comprising a first material layer, a second material layer disposed on the first material layer, a third material layer disposed on the second material layer, and a fourth material layer disposed on the third material layer.

In some embodiments, the first material layer comprises hafnium.

In some embodiments, the second material layer and the fourth material layer comprise zirconium oxide.

In some embodiments, the third material layer comprises aluminum oxide.

Another aspect of the present disclosure provides a method for preparing a capacitor comprising forming a first electrode comprising titanium nitride on a substrate; forming a dielectric film on the first electrode; forming a multilayer film on the dielectric film; and forming a second electrode comprising titanium nitride on the multilayer film.

In some embodiments, the dielectric film comprises aluminum oxide.

In some embodiments, the method further comprises arranging the dielectric film and the multilayer film to structurally stabilize the capacitor.

In some embodiments, the method further comprises arranging the multilayer film in a stacking structure comprising a first material layer, a second material layer disposed on the first material layer, a third material layer disposed on the second material layer, and a fourth material layer disposed on the third material layer.

In some embodiments, the first material layer comprises hafnium, and the second material layer and the fourth material layer comprise zirconium oxide.

In some embodiments, the third material layer comprises aluminum oxide.

Accordingly, the capacitors described in various embodiments of the present disclosure remain structurally stable in the memory cells of the semiconductor devices. The first electrode, the high-k dielectric film, and the multilayer film are arranged to structurally stabilize the capacitor by balancing the stress and strain profile on the capacitor. Due to the hybrid lower electrode of the capacitor, which includes tensile and compressive films formed by the first electrode, the dielectric film, and the multilayer film, the capacitor can remain structurally stable after oxide removal since the stress and strain profile on the cylinder portion of the capacitor has been optimally adjusted. Therefore, the capacitor has desirable properties such as leakage current minimization and can be utilized in semiconductor devices such as DRAMs even as device features shrink.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region element, component, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "feature" refers to parts of a pattern, such as lines, spaces, vias, pillars, trenches, troughs, or moats. As used herein, the term "core" refers to a mask feature formed at a vertical level. As used herein, the term "target layer" refers to a layer in which a pattern of semiconductor structures is to be formed. A target layer may be part of the substrate. A target layer may be a metal layer, a semiconductor layer, and/or an insulating layer formed over the substrate.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch process or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

Figure 1:
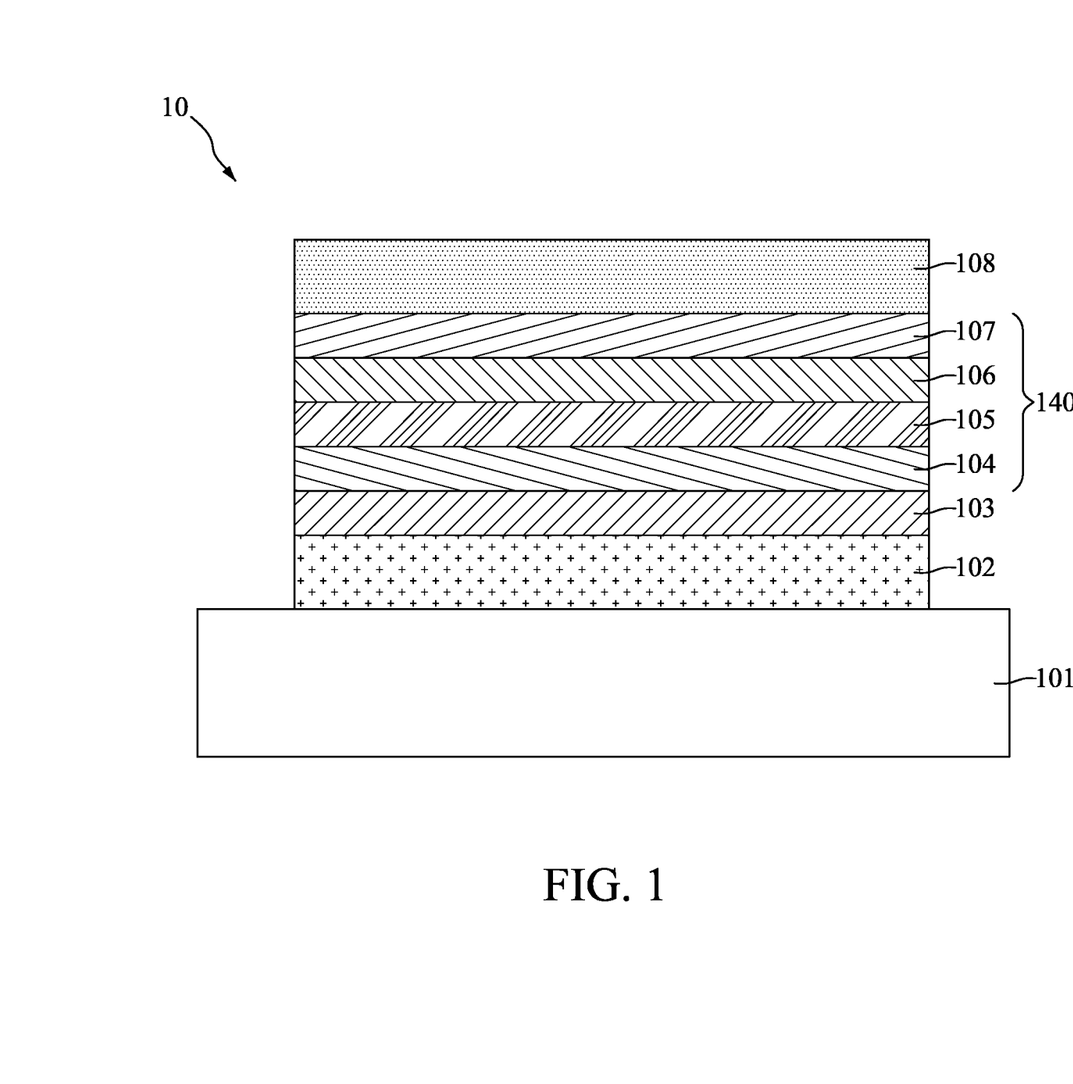
FIG. 1 is a schematic cross-sectional view of a capacitor according to some embodiments of the present disclosure.

FIG. 1 is a schematic cross-sectional view of a capacitor 10 according to some embodiments of the present disclosure. With reference to FIG. 1, the capacitor 10 can be a metal-insulator-metal (MIM) capacitor and includes a substrate 101, a first electrode 102, a dielectric film 103, a multilayer film 140, and a second electrode 108. In some embodiments, the first electrode 102 and the dielectric film 103 form a hybrid lower electrode 110 of the capacitor 10, and the hybrid lower electrode 110 includes a tensile part implemented by the first electrode 102 and a compressive part implemented by the dielectric film 103; in contrast, the second electrode 108 serves as an upper electrode of the MIM capacitor 10. In some embodiments, the first electrode 102 may comprise titanium nitride (TiN) and may be disposed on the substrate 101. The first electrode 102 may be a tensile film arranged to optimize the tensile strength of the capacitor 10. The dielectric film 103 may comprise aluminum oxide ($Al_2O_3$) and may be disposed on the first electrode 102. In some embodiments, the dielectric film 103 may be a compressive film arranged to optimize the compressive strength of the capacitor 10.

Referring to FIG. 1, the multilayer film 140 is disposed on the dielectric film 103 and serves as a capacitor insulator between two metal electrodes of the MIM capacitor. In some embodiments, the multilayer film 140 may be arranged in a stacking structure comprising a first material layer 104, a second material 105 disposed on the first material layer 104, a third material layer 106 disposed on the second material layer 105, and a fourth material layer 107 disposed on the third material layer 106.

In some embodiments, the first material layer 104 comprises hafnium (Hf), although the present disclosure is not limited thereto. In some embodiments, the first material 104 may comprise at least one of Si, Sn, Sr, Ti, Y, La, Ga, Gd, Ge, Al, Co, or combinations thereof, for example. In some embodiments, the second electrode 108 comprises TiN and may be disposed on the multilayer film 140. It should be noted that, in other embodiments of the present disclosure, either one or both of the first electrode 102 and the second electrode 108 may comprise of other materials such as titanium oxide (TiO), for example. In some embodiments, the second material layer 105 and the fourth material layer 107 comprises zirconium oxide ($ZrO_2$). In some embodiments, the third material layer 106 comprises $Al_2O_3$, and thus the multilayer film 140 may be arranged as a HZAZ stacked structure (i.e., $Hf/ZrO_2/Al_2O_3/ZrO_2$) on the dielectric film 103.

In some embodiments, the substrate 101 may include any suitable material including, but not limited to, Si, SiC, SiGe, SiGeC, GaAs, InP, InAs, and other II/VI or III/V compound semiconductors. In some embodiments, the substrate 101 may also include other components such as transistors, resistors, capacitors, diodes, etc. In some embodiments, the substrate 101 may further include an interconnection structure (not shown), including alternating stacking of wiring layers and vias disposed over the components, and one or more interlayer dielectrics encircling the wiring layers and the vias (not shown). The substrate 101 may include a semiconductor wafer, semiconductor chip, or wafer portion, for example. The substrate 101 may include a plurality of alternating dielectric and metal interconnect layers overlying an upper metal layer (not shown). It should be noted that, the substrate 101 may also be any of a variety of other structures known to those skilled in the art including, but not limited to, ceramic and organic based substrates.

Figure 2:
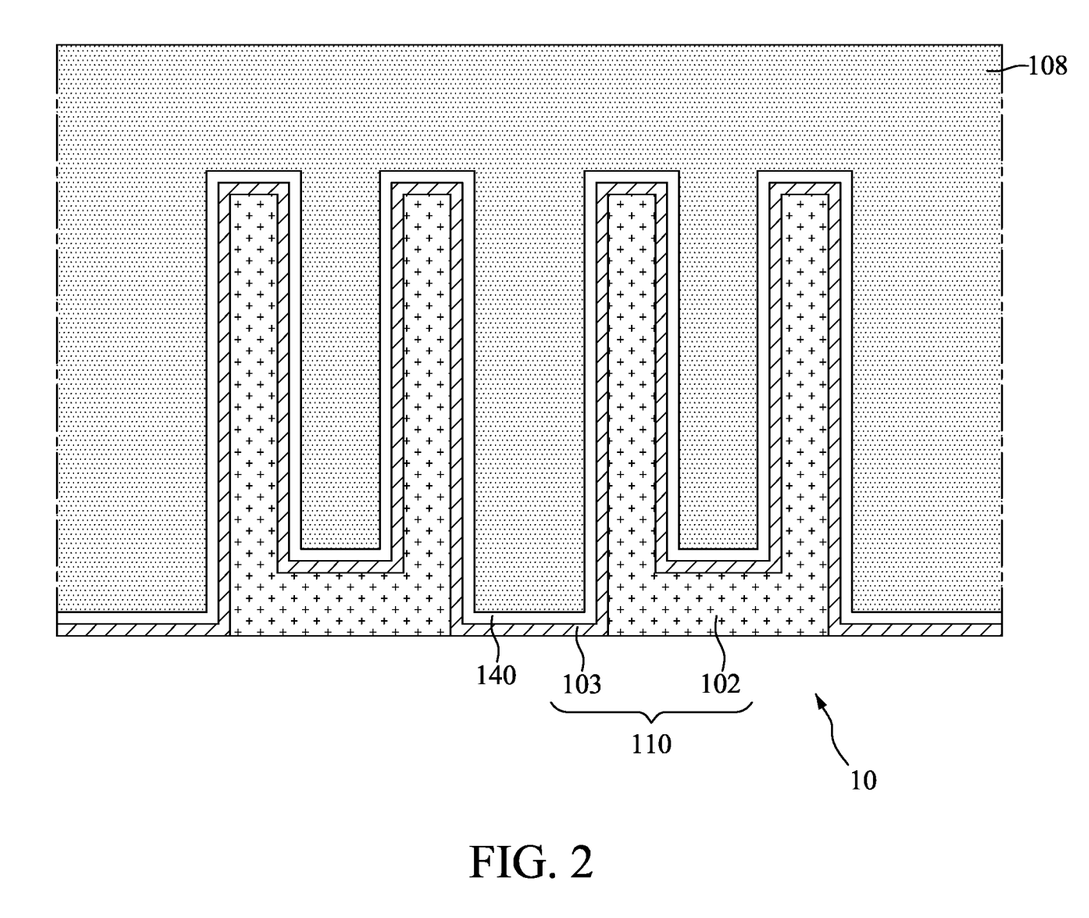
FIG. 2 is a cross-sectional view of a capacitor according to some embodiments of the present disclosure.

FIG. 2 is a cross-sectional view of the capacitor 10 according to some embodiments of the present disclosure. With reference to FIG. 2, in some embodiments, the first electrode 102, the high-k dielectric film 103, and the multilayer film 140 are arranged to structurally stabilize the capacitor 10 by balancing the stress and strain profile on the capacitor 10. Due to the hybrid lower electrode of the capacitor 10, which includes tensile and compressive films formed by the first electrode 102, the dielectric film 103, and the multilayer film 140, the capacitor 10 can remain structurally stable after oxide removal since the stress and strain profile on the cylinder portion of the capacitor 10 has been optimally adjusted. Therefore, the capacitor 10 has desirable properties such as leakage current minimization and can be utilized in semiconductor devices such as dynamic random-access memories (DRAMs) even as device features shrink toward the ~10 nm technology node.

During the formation of the capacitor 10, before forming the multilayer film 140 over the hybrid lower electrode and the second electrode 108 over the multilayer film 140, the hybrid lower electrode in cylinder profile is form by an oxide removal process, and the hybrid lower electrode in cylinder profile can remain structurally stable after oxide removal process since the stress and strain profile on the cylindrical hybrid lower electrode has been optimally adjusted. Therefore, the capacitor 10 has desirable properties such as leakage current minimization and can be utilized in semiconductor devices such as DRAMs even as device features shrink.

Figure 3:
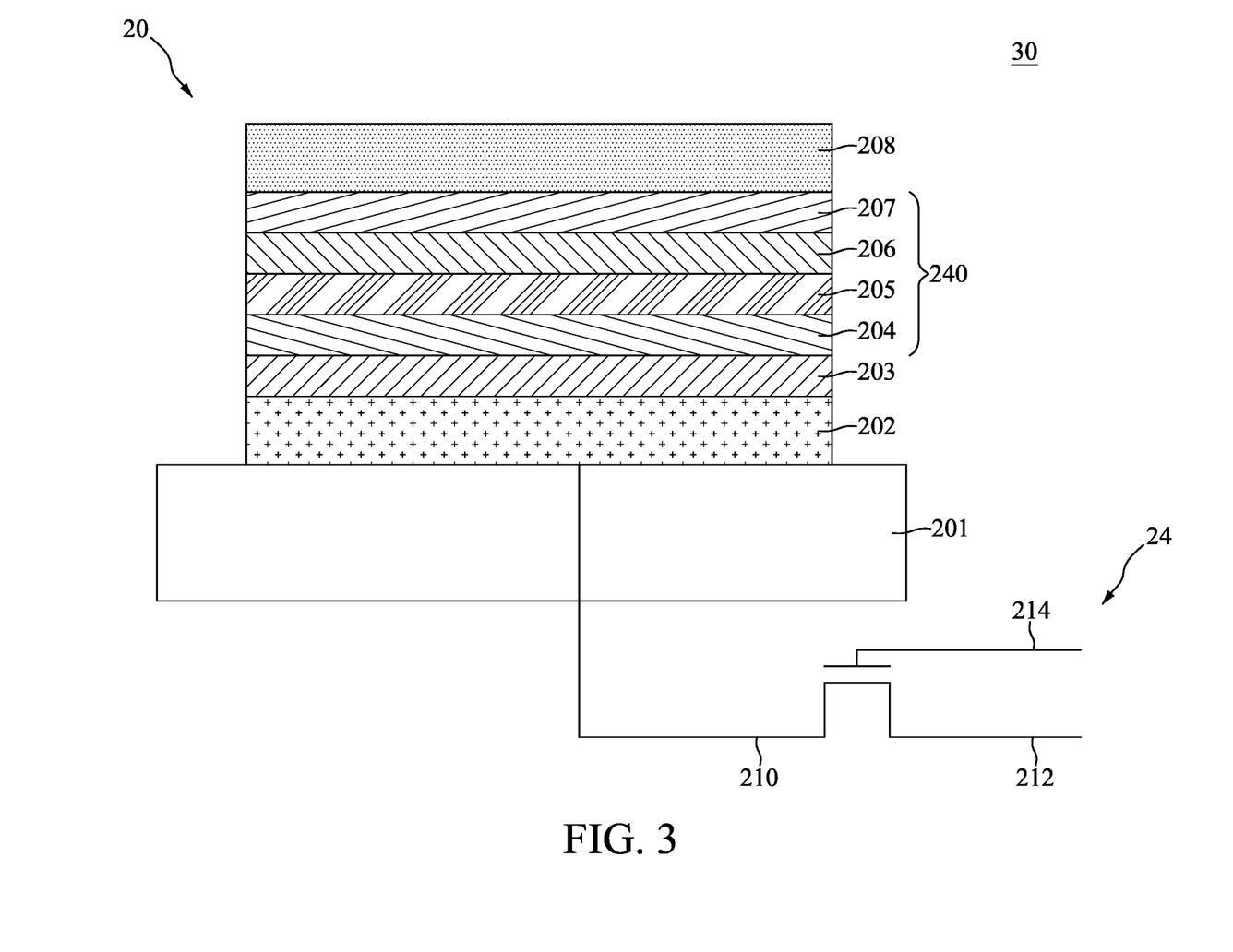
FIG. 3 is a schematic cross-sectional view of a memory cell according to some embodiments of the present disclosure.
Figure 4:
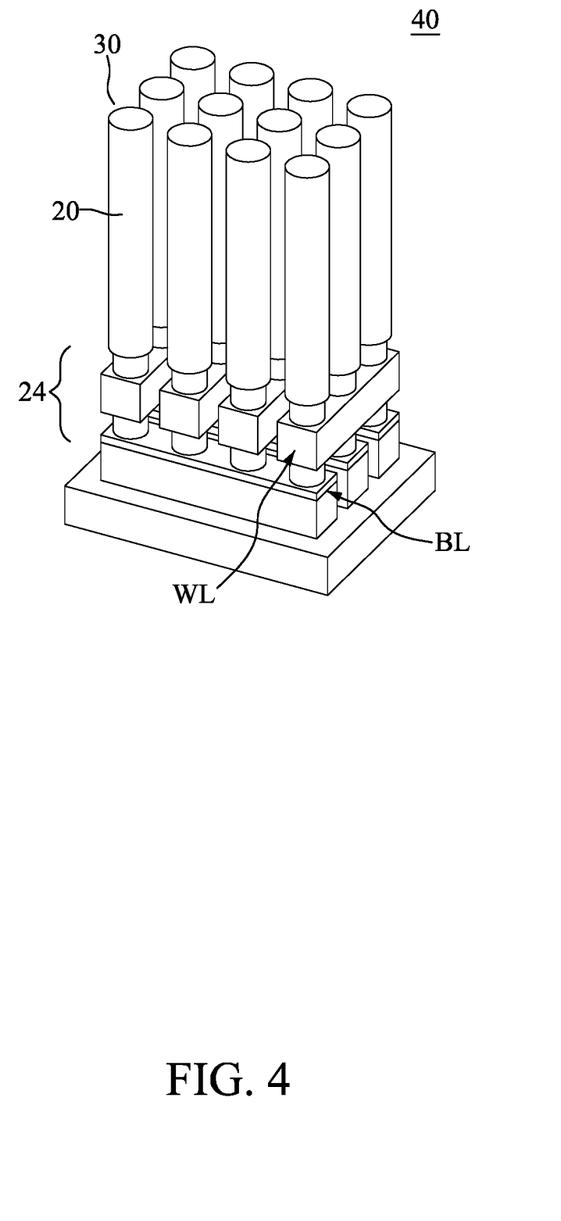
FIG. 4 is a perspective view of a semiconductor device according to some embodiments of the present disclosure.

FIG. 3 is a schematic cross-sectional view of a memory cell 30 according to some embodiments of the present disclosure. FIG. 4 is a perspective view of a semiconductor device 40 according to some embodiments of the present disclosure. With reference to FIG. 3 and FIG. 4, in some embodiments, the semiconductor device 40 may be a DRAM comprising a plurality of the memory cells 30. At least one of the memory cell 30 may principally include a capacitor 20 and a transistor 24. The transistor 24 of the memory cell 30 may be a vertical pillar metal oxide semiconductor (MOS) transistor having a gate 214, source 210, and a drain 212. The gate 214 is usually connected to a word line WL and one of the source 210 or the drain 212 is connected to a bit line BL. The capacitor 20 has a lower or storage electrode (i.e., a first electrode 202) and an upper or plate electrode (i.e., a second electrode 208). In some embodiments, the storage electrode may be connected to the other of the source 210 or drain 212 and the plate electrode may be connected to a reference potential conductor. The transistor 24 is, when selected, turned "on" by an active level of the word line to read or write data from or into the capacitor 20 via the bit line.

In some embodiments, the capacitor 20 may be similar to the capacitor 10 previously described in the present disclosure. The capacitor 20 includes a substrate 201, the first electrode 202, a dielectric film 203, a multilayer film 240, and the second electrode 208. In some embodiments, the first electrode 202 may comprise TiN and may be disposed on the substrate 201. The first electrode 202 may be a tensile film arranged to optimize the tensile strength of the capacitor 20. The dielectric film 203 may comprise $Al_2O_3$ and may be disposed on the first electrode 202. In some embodiments, the dielectric film 203 may be a high-k compressive film arranged to optimize the compressive strength of the capacitor 20. The multilayer film 240 is disposed on the dielectric film 203. In some embodiments, the multilayer film 240 may be arranged in a stacking structure comprising a first material layer 204, a second material 205 disposed on the first material layer 204, a third material layer 206 disposed on the second material layer 205, and a fourth material layer 207 disposed on the third material layer 206.

In some embodiments, the first material layer 204 comprises Hf, although the present disclosure is not limited thereto. In some embodiments, the first material 204 may comprise at least one of Si, Sn, Sr, Ti, Y, La, Ga, Gd, Ge, Al, Co, or combinations thereof, for example. In some embodiments, the second electrode 208 comprises TiN and may be disposed on the multilayer film 240. It should be noted that, in other embodiments of the present disclosure, either one or both of the first electrode 202 and the second electrode 208 may comprise of other materials such as TiO, for example, or other conductive metal nitrides such as cobalt nitride, nickel nitride, molybdenum nitride, tantalum nitride, titanium aluminum nitride, tungsten nitride, or combinations thereof. In some embodiments, the second material layer 205 and the fourth material layer 207 comprises $ZrO_2$. In some embodiments, the third material layer 206 comprises $Al_2O_3$, and thus the multilayer film 140 may be arranged as a HZAZ stacked structure (i.e., $Hf/ZrO_2/Al_2O_3/ZrO_2$) on the dielectric film 203.

Figure 5:
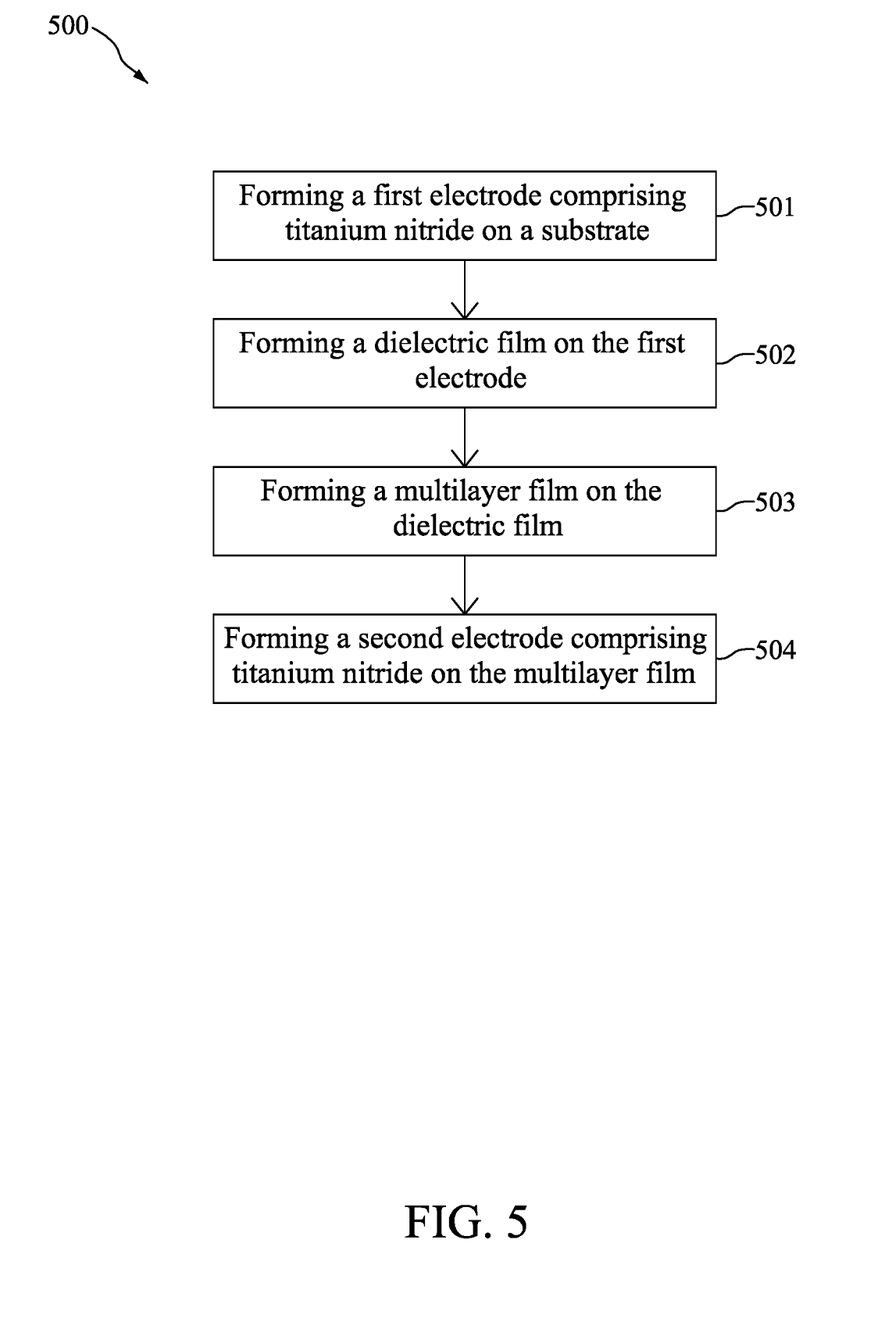
FIG. 5 is a flow diagram of a method for preparing a capacitor according to some embodiments of the present disclosure.
Figure 6:
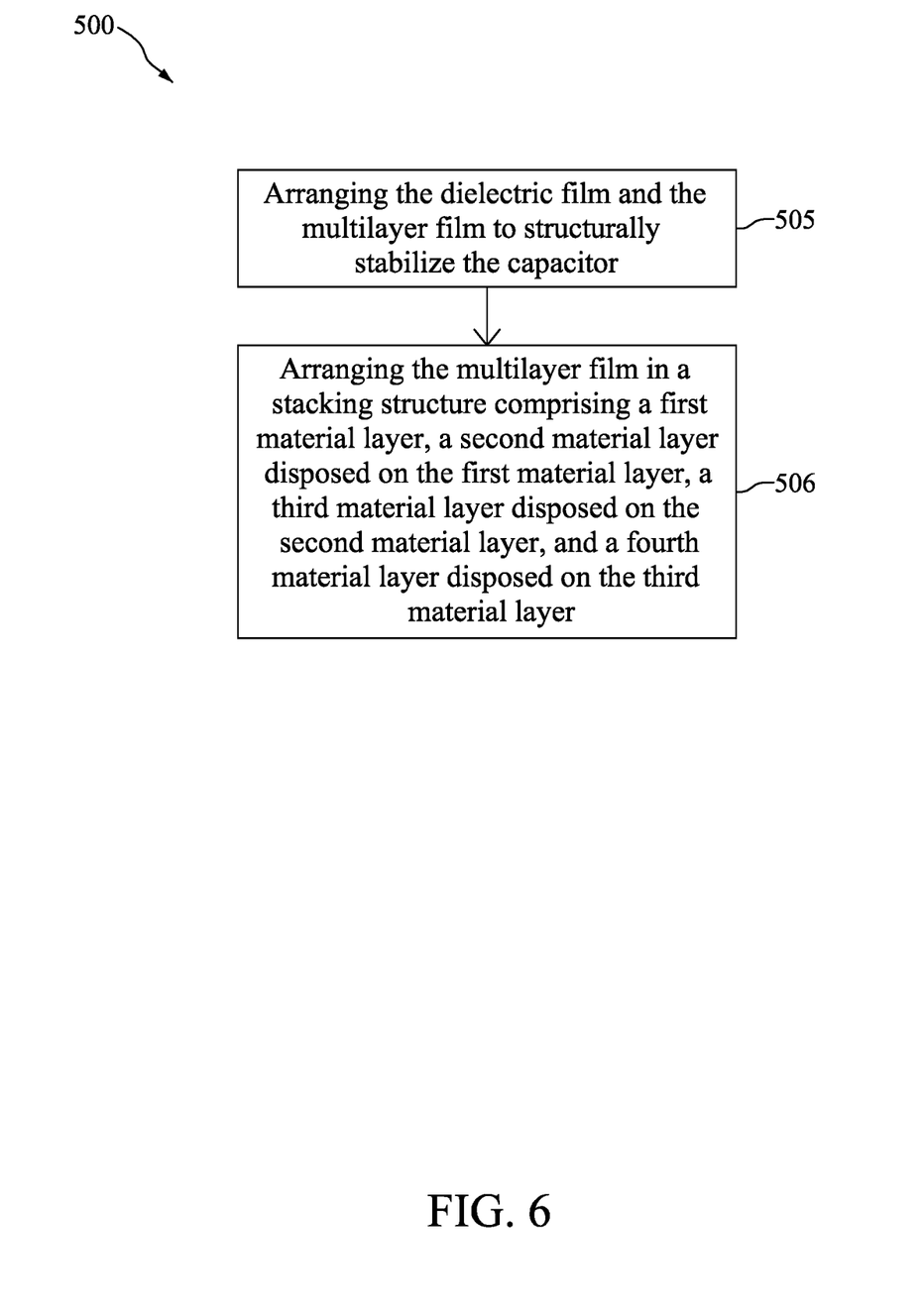
FIG. 6 is a flow diagram depicting additional steps of a method for preparing a capacitor according to some embodiments of the present disclosure.

In view of the capacitors 10 and 20 described earlier in the present disclosure, a method for preparing a capacitor can be further detailed. FIG. 5 is a flow diagram of a method 500 for preparing the capacitor 10 according to some embodiments of the present disclosure. FIG. 6 is a flow diagram depicting additional steps of the method 500 for preparing the capacitor 10 according to some embodiments of the present disclosure. With reference to FIG. 5 and FIG. 6, the method 500 for preparing the capacitor 10 may include forming a first electrode 102 comprising TiN on the substrate 101 (Step 501). The titanium nitride of the first electrode 102 may be formed using PVD, PECVD, CVD, or ALD, for example. In some embodiments, the first electrode 102 may optionally receive an RTA anneal treatment before the formation of the dielectric film 103 and the multilayer film 140. In Step 502, the dielectric film 103 is disposed on the first electrode 102, and in Step 503, the multilayer film 140 is disposed on the dielectric film 103. The dielectric film 103 and the multilayer film 140 may be formed using ALD, PE-ALD, PECVD, or CVD, for example. In step 504, the second electrode 108 comprising TiN is disposed on the multilayer film 140 (Step 504). The titanium nitride of the second electrode 108 may be formed using PVD, PECVD, CVD, or ALD. In some embodiments, the capacitor 10 may further receive a pre-metal-annealing (PMA) treatment, for example.

In some embodiments, the dielectric film 103 comprises $Al_2O_3$. In some embodiments, the compressive dielectric film 103 may be formed using a BPSG wet oxide etch process. In some embodiments, the method 500 further comprises arranging the dielectric film 103 and the multilayer film 140 to structurally stabilize the capacitor 10 (Step 505), as shown in FIG. 6. In some embodiments, the dielectric film 103 may be a high-k compressive film arranged to optimize the compressive strength of the capacitor 10. In some embodiments, the method 500 further comprises arranging the multilayer film 140 in a stacking structure comprising the first material layer 104, the second material layer 105 disposed on the first material layer 104, the third material layer 106 disposed on the second material layer 105, and the fourth material layer 107 disposed on the third material layer 106 (Step 506). In some embodiments, the first material layer 104 comprises Hf, and the second material layer 105 and the fourth material layer 107 comprise zirconium oxide $ZrO_2$. In some embodiments, the third material layer 106 comprises $Al_2O_3$.

Figure 7:
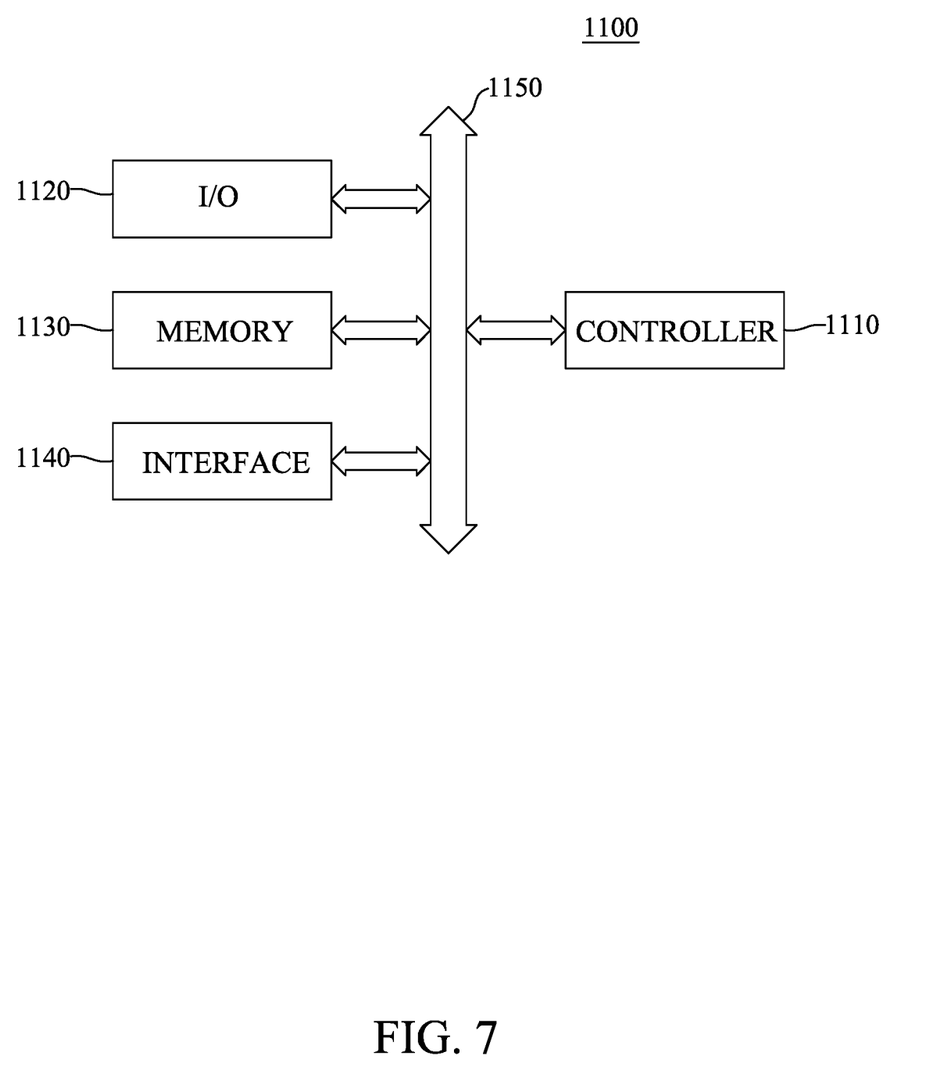
FIG. 7 is a block diagram of an electronic system including semiconductor devices having capacitors according to some embodiments of the present disclosure.

FIG. 7 is a block diagram of an electronic system 1100 including semiconductor devices having capacitors according to some embodiments of the present disclosure. With reference to FIG. 7, the electronic system 1100 according to some embodiments of the present disclosure may include a controller 1110, an input/output (I/O) device 1120, a memory 1130, an interface 1140, and a bus 1150. The controller 1110, the I/O device 1120, the memory 1130, and/or the interface 1140 may be connected to each other through the bus 1150. The bus 1150 may correspond to a path through which data moves. The controller 1110 may include at least one of a microprocessor, a digital signal processor, a microcontroller, and logic devices capable of performing similar functions to those performed by these devices. The I/O device 1120 may include a keypad, a keyboard, a display device, and the like. The memory 1130 may store data and/or instructions. The memory 1130 may include semiconductor devices according to some embodiments of the present disclosure. For example, the memory 1130 may include a DRAM. The interface 1140 may transmit/receive data to/from a communication network. The interface 1140 may be wired or wireless. For example, the interface 1140 may include an antenna or a wired/wireless transceiver. In some embodiments, the electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 8:
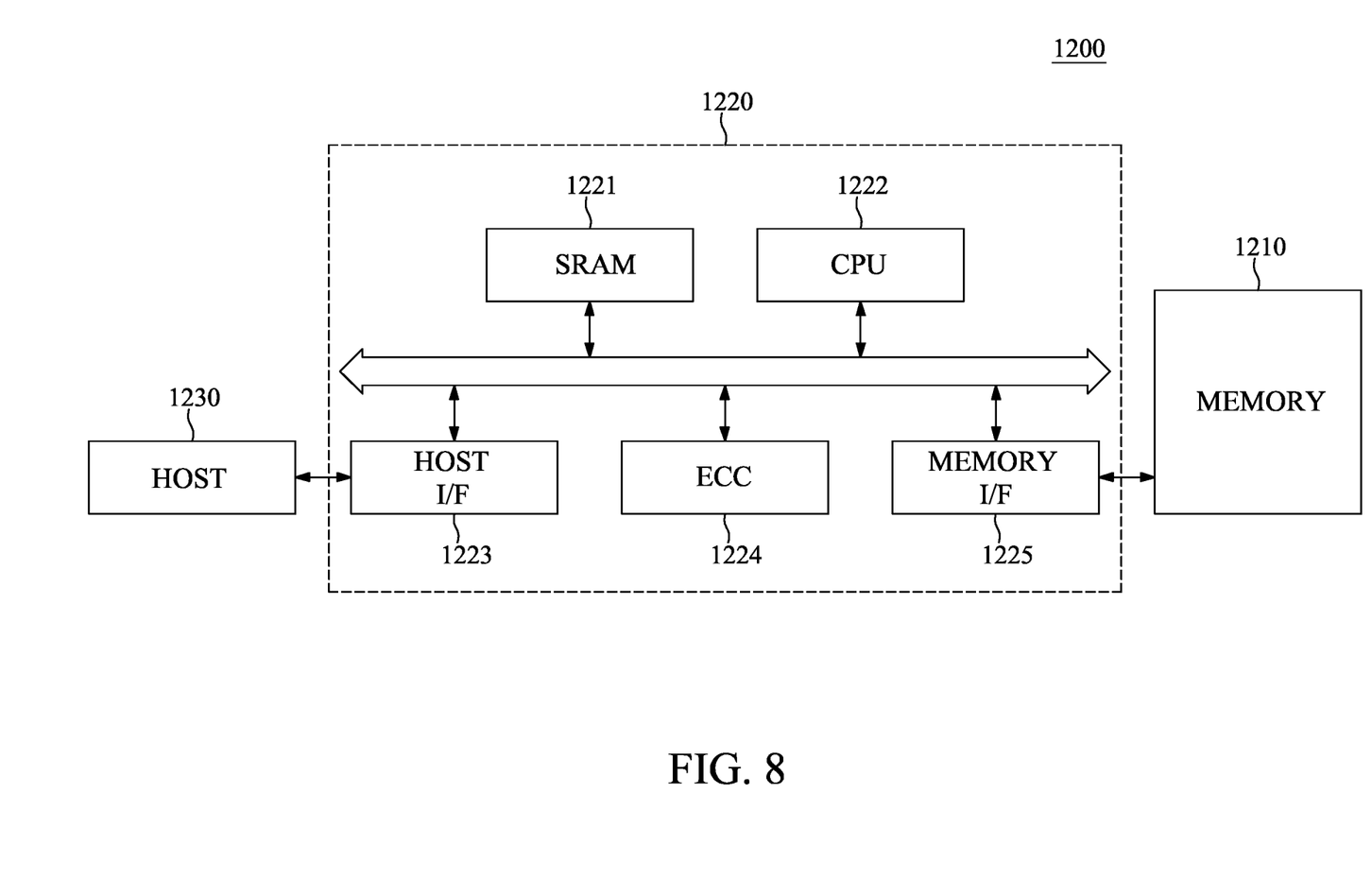
FIG. 8 is a block diagram of a memory card including semiconductor devices having capacitors according to some embodiments of the present disclosure.

FIG. 8 is a block diagram of a memory card including semiconductor devices having capacitors according to some embodiments of the present disclosure. With reference to FIG. 8, the memory 1210 including the semiconductor devices according to various embodiments of the present disclosure may be employed to a memory card 1200. In some embodiments, the memory card 1200 may include a memory controller 1220 controlling data exchange between a host 1230 and a memory 1210. A static random access memory (SRAM) 1221 may be used as an operating memory of a central processing unit (CPU) 1222. A host interface 1223 may include a protocol for exchanging data by allowing the host 1230 to be connected to the memory card 1200. An error correction code (ECC) 1224 may detect an error from data read from the memory 1210 to then correct the detected error. A memory interface 1225 may interface with the memory 1210. The CPU 1222 may perform the overall control operation associated with the data exchange of the memory controller 1220.

Accordingly, the capacitors described in various embodiments of the present disclosure remain structurally stable in the memory cells of the semiconductor devices. The first electrode 102, the high-k dielectric film 103, and the multilayer film 140 are arranged to structurally stabilize the capacitor 10 by balancing the stress and strain profile on the capacitor 10. Due to the hybrid lower electrode of the capacitor 10, which includes tensile and compressive films formed by the first electrode 102, the dielectric film 103, and the multilayer film 140, the capacitor 10 can remain structurally stable after oxide removal since the stress and strain profile on the cylinder portion of the capacitor 10 has been optimally adjusted. Therefore, the capacitor 10 has desirable properties such as leakage current minimization and can be utilized in semiconductor devices such as DRAMs even as device features shrink.

One aspect of the present disclosure provides a capacitor, comprising a first electrode comprising titanium nitride and disposed on a substrate; a dielectric film disposed on the first electrode; a multilayer film disposed on the dielectric film; and a second electrode comprising titanium nitride and disposed on the multilayer film.

Another aspect of the present disclosure provides a semiconductor device, comprising a plurality of memory cells, at least one of the memory cells comprising a capacitor, the capacitor comprising: a first electrode comprising titanium nitride and disposed on a substrate; a dielectric film disposed on the first electrode; a multilayer film disposed on the dielectric film; and a second electrode comprising titanium nitride and disposed on the multilayer film.

Another aspect of the present disclosure provides a method for preparing a capacitor comprising forming a first electrode comprising titanium nitride on a substrate; forming a dielectric film on the first electrode; forming a multilayer film on the dielectric film; and forming a second electrode comprising titanium nitride on the multilayer film.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A capacitor, comprising:
   a first electrode comprising a tensile part disposed on a substrate;
   a dielectric film comprising a compressive part disposed on the first electrode, wherein the first electrode and the dielectric film form a hybrid lower electrode;
   a multilayer film disposed on the dielectric film, wherein the multilayer is arranged in a stacking structure comprising a first material layer directly deposited on the dielectric film, a second material layer disposed on the first material layer, a third material layer disposed on the second material layer, and a fourth material layer disposed on the third material layer, and wherein the first material layer includes hafnium, the second material layer and the fourth material layer include zirconium oxide, and the third material layer includes aluminum oxide; and
   a second electrode comprising titanium nitride and disposed on the multilayer film.

2. The capacitor of claim 1, wherein the first electrode comprises titanium nitride and the dielectric film comprises aluminum oxide.

3. The capacitor of claim 1, wherein the first electrode, the dielectric film, and the multilayer film are arranged to structurally stabilize the capacitor.

4. A semiconductor device, comprising:
   a plurality of memory cells, at least one of the memory cells comprising a capacitor, the capacitor comprising:
   a first electrode comprising a tensile part disposed on a substrate;
   a dielectric film comprising a compressive part disposed on the first electrode, wherein the first electrode and the dielectric film form a hybrid lower electrode;
   a multilayer film disposed on the dielectric film, wherein the multilayer is arranged in a stacking structure comprising a first material layer directly deposited on the dielectric film, a second material layer disposed on the first material layer, a third material layer disposed on the second material layer, and a fourth material layer disposed on the third material layer, and wherein the first material layer includes hafnium, the second material layer and the fourth material layer include zirconium oxide, and the third material layer includes aluminum oxide; and
   a second electrode comprising titanium nitride and disposed on the multilayer film.

5. The semiconductor device of claim 4, wherein the first electrode comprises titanium nitride and the dielectric film comprises aluminum oxide.

6. The semiconductor device of claim 4, wherein the first electrode, the dielectric film, and the multilayer film are arranged to structurally stabilize the capacitor.

7. A method for preparing a capacitor comprising:
   forming a first electrode comprising a tensile part on a substrate;
   forming a dielectric film comprising a compressive part on the first electrode, wherein the first electrode and the dielectric film form a hybrid lower electrode;
   arranging a multilayer film in a stacking structure deposed on the dielectric film, wherein the stacking structure comprises a first material layer directly deposited on the dielectric film, a second material layer disposed on the first material layer, a third material layer disposed on the second material layer, and a fourth material layer disposed on the third material layer, and wherein the first material layer includes hafnium, the second material layer and the fourth material layer include zirconium oxide, and the third material layer includes aluminum oxide; and
   forming a second electrode comprising titanium nitride on the multilayer film.

8. The method of claim 7, wherein the first electrode comprises titanium nitride and the dielectric film comprises aluminum oxide.

9. The method of claim 7, further comprising arranging the first electrode, the dielectric film, and the multilayer film to structurally stabilize the capacitor.

* * * * *